United States Patent [19]

Egawa

[11] Patent Number: 4,750,891
[45] Date of Patent: Jun. 14, 1988

[54] LATTICE SHAPED ARRANGEMENT TYPE SOCKET FOR IC PACKAGE

[75] Inventor: Yoshinori Egawa, Tokyo, Japan
[73] Assignee: Yamaichi Electric Mfg. Co. Ltd., Tokyo, Japan
[21] Appl. No.: 21,355
[22] Filed: Mar. 3, 1987
[51] Int. Cl.⁴ .......................................... H01R 13/629
[52] U.S. Cl. .................................... 439/259; 439/264
[58] Field of Search .............. 439/259, 262, 263, 264, 439/266, 268, 269

[56] References Cited

U.S. PATENT DOCUMENTS

| | | | |
|---|---|---|---|
| 4,012,099 | 3/1977 | Worcester | 439/264 |
| 4,341,429 | 7/1982 | Bright et al. | 439/268 |
| 4,420,205 | 12/1983 | Kirkman | 439/266 |
| 4,538,870 | 9/1985 | Thewlis | 439/259 |
| 4,674,811 | 6/1987 | Corwin | 439/259 |

FOREIGN PATENT DOCUMENTS

58-150281 9/1983 Japan .

Primary Examiner—John McQuade
Attorney, Agent, or Firm—Wenderoth, Lind & Ponack

[57] ABSTRACT

There is disclosed a socket for an IC package in which many IC lead wires project from the IC package and are arranged in vertical rows Y and lateral rows X, and the respective IC lead wires are arranged at equal pitches on the vertical rows Y and the lateral rows X. The socket, has a base plate having contacts and an IC mounting cover for moving the IC package between a contact engaging position and a release position. The cover is cross movably overlapped on the base plate. The IC mounting cover has many IC insertion holes arranged in a lattice shape. The respective rows X and Y of the IC lead wire insertion hole groups are inclined at the same angles with respect to respective sides of the cover. The diagonal lines W of the lattice shaped arrangement are arranged in parallel with two sets of opposite sides of the cover respectively. The repective rows X and Y of the contact groups are inclined at same angles with respect to the respective sides of the socket base plate. The diagonal lines W of the lattice shaped arrangement are arrranged in parallel with two sets of opposite sides of the socket base plate. The contacting pieces of the contacts are arranged as such that contacting points of the contacts and IC lead wires are facing in the direction of the diagonal lines W of the respective lattice shaped arrangements.

2 Claims, 7 Drawing Sheets

LATTICE SHAPED ARRANGEMENT TYPE SOCKET FOR IC PACKAGE

BACKGROUND OF THE INVENTION

This invention relates to a socket for a lattice shaped arrangement type IC package having a group of IC lead wires.

In general, this type of socket is for an IC package arranged in a lattice shape including a group of IC lead wire holes arranged in a lattice shape and a group of contacts for contacting IC lead wires placed under the group of IC lead wire holes corresponding thereto and arranged in a lattice shape as disclosed in, for example, Japanese Patent Early Laid-open Publication No. 58-150281. It is a common structure for them that contacting piece portions (which form contacting points with IC lead wires) of all contacts arranged in a lattice shape as mentioned above are arranged on vertical lines or lateral lines of the lattice-shaped arrangement so that the displacement for the contact engaging or release of the afore-mentioned contacts is performed in the direction of the vertical lines or lateral lines (within a space corresponding to a pitch of adjacent IC lead wires).

The IC lead wires of the IC lead wires for the IC package arranged in a lattice shape are arranged at very narrow pitches. In recent years, the tendency is toward the lead wire pitches becoming much narrower and the lead wires being arranged in higher density in a lattice shape.

Heretofore, for example, lattice shapedly arranged IC package having an International Standard pitch of 2.54 mm (space between adjacent IC lead wires) have been widely used. In recent years, a lattice shapedly arranged IC package having a pitch of 1.27 mm or less was provided. This is less than one half of the International Standard. Therefore, suitable IC sockets are demanded.

However, if an IC socket having the above-mentioned structure is applied to an IC package in which the lead wire pitch is reduced to one half, each contact for contacting each of the IC lead wires is required to be arranged within the space (within a space between adjacent IC lead wire holes having a 1.27 mm pitch) of the afore-mentioned 1.27 mm pitch between the IC lead wires. In addition, an amount of displacement enough for contact engaging and releasing in the 1.27 mm pitch must be provided. This is a very difficult condition to satisfy in view of manufacture.

Known contacts of the above-described type are the single spring type in which a contact pressure is given to one side of IC lead wires and also of the double spring type in which a contact pressure is given to both sides of IC lead wires. In either case, the contacting piece portion is usually warped or bent in a reversed L-shape, U-shape and the like, or otherwise the whole contacting piece is inclined to obtain a satisfactory elasticity. Naturally, the contact itself has a required width in the longitudinal direction. In addition, a back space must be formed behind the contact for permitting displacement for contact engaging or releasing of the contact. Furthermore, it is required to provide a space and a partition wall between the adjacent contacts for insulation. While, in a retractable socket of low resistance in which the IC lead wire is moved from the release position to the contact engaging position with respect to a contact and held between adjacent contacts or urged against the contact, a moving stroke of the IC lead wire is required.

In the conventional sockets having the above-described structure, the mounting width (a space enough for mounting the contact itself) of the contact itself and the back space for displacement and, in addition, the partition wall, etc. for insulation must be provided within a space corresponding to the IC lead wire pitch. However, it becomes more and more difficult to satisfy the above requirements within the space corresponding to the IC lead wire pitch which is coming to be much narrower as mentioned above. Further, in both of the single spring type socket and the double spring type socket, miniturization is restricted in view of the necessity for preventing deformation and obtaining a proper elastic displacement. Particularly, in a zero insertion type IC socket in which a contacting piece forming the contact is required to be spread wider, a wider back space is required. On the other hand, in a socket of the type in which the IC lead wire is moved between the contact engaging position and the release position, a moving stroke of the IC lead wire is required. In such a case, there are possibilities that the conventional types are not usable.

SUMMARY OF THE INVENTION

The present invention, has been made in order to solve the above-mentioned problems fundamentally.

It is therefore the object of the present invention to provide a socket for an IC package arranged in a lattice shape, in which a contact having the initially intended performance can be obtained without spoiling (without limitation of miniturization of a contact and bending deformation) the strength and elastic effect of a contact for contacting an IC lead wire arranged in a lattice shape and a sufficient space for mounting the contact, a sufficient back space for elastic displacement, a sufficient space for forming a partition wall for insulation and the like are provided, thereby to accomodate the narrower pitch of the IC lead wire properly and effectively.

In order to achieve the above object, there is essentially provided a socket for an IC package in which a plurality of IC lead wires project from a lower surface of a main body of the IC package and arranged in a lattice shape consisting of vertical rows Y and lateral rows X, and the respective IC lead wires are arranged at equal pitches on the vertical rows Y and the lateral rows X with respect to one another. The socket comprises a base plate as main body of the socket having contacts for contacting the IC lead wires and an IC mounting cover for mounting the IC package and moving the IC package between a contact engaging position and a release position, the base plate and cover constituting the IC socket being formed of an insulating material having a square outer configuration, the cover being cross movably overlapped on the upper surface of the base plate, the IC mounting cover having a plurality of IC insertion holes arranged in a lattice shape corresponding to the lattice shaped arrangement of the IC lead wires, the respective rows X and Y of the IC lead wire insertion hole group arranged in a lattice shape being inclined at the same angles with respect to respective sides of the cover, diagonal lines W of the lattice shaped arrangement extending in two directions being arranged in parallel with two sets of facing sides of the cover respectively, the socket base plate having a group of a plurality of contact arranged in a lattice shape corresponding to the IC lead wire group and IC lead wire insertion group, the respective rows X and Y of the contact groups arranged in a lattice shape being inclined at the same angles with respect to the respective sides of the socket base plate, the diagonal lines W of the lattice shaped arrangement extending in two directions being arranged in parallel with two sets of facing sides of the socket base plate, the IC mounting cover overlapped on the socket base plate being parallelly movable in the direction of one of the diagonal lines W of the lattice shaped arrangements of the insertion holes and contacts, means being provided for providing power to move the cover in the direction of the diagonal line (W), an IC package mounted on the cover being moved as the cover moves, the IC lead wires inserted into a contact accommodating portion piercing through the lead wire insertion holes of the cover being moved from the release position to the contact engaging position with respect to the contacts and from the contact engaging position to the release position, contacting pieces of the contacts being arranged such that contacting points of the contacts and IC lead wires are formed in the direction of the diaganol lines W of the respective lattice shaped arrangements, displacement for contact engaging and release of the contacts being performed in the direction of the diaganol lines W.

The respective rows X and Y of the lattice shapedly arranged IC lead wire insertion hole group are inclined at 45° with respect to the respective sides of the cover, the diagonal lines W of the lattice shaped arrangement extending in two directions are arranged in parallel with two sets of facing sides respectively, and, similarly, the respective rows X and Y of the lattice shapedly arranged contact group are inclined at 45° with respect to the respective sides of the socket base plate and the diagonal lines W of the lattice shaped arrangement extending in two directions are arranged in parallel with two sets of facing sides of the socket base plate.

BRIEF DESCRIPTION OF THE DRAWINGS

The several features and advantages of the present invention will become more apparent to those skilled in the art by reference to the detailed description which follows taken in conjunction with the several figures of the drawing in which:

FIGS. 7(A) and 7(B) are sectional views taken on line 7—7 of FIG. 5 in which FIG. 7(A) shows a released state and FIG. 7(B) shows a contacting state; and FIGS. 8(A) and 8(B) are sectional views taken on line 8—8 of FIG. 6, in which FIG. 8(A) shows a released state and FIG. 8(B) shows a contacting state.

DETAILED DESCRIPTION OF THE EMBODIMENT

One preferred embodiment of the present invention will be described in detail hereinafter with reference to FIGS. 1 through 8.

In the figures, 1 denotes a lattice-shaped arrangement type IC package and 2 denotes a socket for the IC package 1.

The IC package 1 includes a plurality of IC lead wires 3 having a circular shape in section. The IC lead wires 3 project from a lower surface of the IC package 1 and are arranged in a lattice shape consisting of vertical rows Y and lateral rows X. The respective IC lead wires 3 are arranged at equal pitches with respect to one another on the vertical rows Y and lateral rows X.

The socket 2 comprises a base plate 4 as socket main body having a contacts for contacting IC lead wires and an IC mounting cover 5 for mounting the IC package thereon and moving it between a contact engaging position and a release position.

The IC socket 2 (base plate 4 and cover 5) is formed of a suitable insulating material having a square outer configuration. The cover 5 is cross movably overlapped on an upper surface of the base plate 4.

The IC mounting cover 5 has a plurality of lead wire insertion holes 7 arranged in a lattice shape corresponding to the lattice shaped arrangement of the IC lead wires 3. A square area (parallelogram) D on which groups of the insertion holes 7 are spread is arranged at a position rotated by a predetermined angle with respect to the outer configuration of the cover 5.

More specifically, the square area D is arranged such that the respective rows X and Y of the IC lead wire insertion holes 7 arranged in a lattice shape are inclined at equal angles, preferably 45°, with respect to the respective sides of the cover 5 and the diagonal lines W of the lattice shaped arrangement extending in two directions are in parallel relation with respect to two sets of opposite sides of the cover 5 respectively.

Furthermore, the socket base plate 4 has a group of a plurality of contacts 10 arranged in a lattice shape corresponding to the group of IC lead wires 3 and the group of IC lead wire insertion holes 7. A square area (parallelogram) D on which the group of contacts 10 are spread is arranged at a position rotated by a predetermined angle with respect to the outer configuration of the base plate 4 in the same manner as the spreading pattern of the group of IC lead wire insertion holes 7. More specifically, the square area D is arranged such that the respective rows X and Y of the group of contacts arranged in a lattice shape are inclined at equal angles, preferably 45°, with respect to the respective sides of the socket base plate and the diagonal lines W of the lattice shaped arrangement extending in two directions are in parallel relation with respect to two sets of opposite sides of the base plate respectively.

The IC lead wire insertion holes 7 and contacts 10 are arranged at equal pitches on the vertical rows Y and the lateral rows X respectively as in the case of the IC lead wires.

The IC mounting cover 5 and socket base plate 4 are overlapped such that the IC lead wire insertion holes 7 and contacts 10 are aligned. In the overlapped relation, the IC package 1 is mounted on the upper surface of the cover 5 permitting the IC lead wires 3 to pierce through the respective IC lead wire insertion holes 7 to contact the contacts 10.

The IC mounting cover 5, in the overlapped relation, is movable in a direction parallel with one of the diagonal directions W of the lattice shaped arrangements of the insertion holes 7 and contacts 10.

An L-shaped lever 6, known per se, constitutes means to supply the moving power to the cover 5. A lever portion which is bent in one direction serves as a cam shaft 6a interposed between the cover 5 and base plate 4 and a lever portion which is bent in the other direction serves as a handle 6b, so that the turning of the handle 6b causes the cam shaft 6a to be pivoted and the cover 5 is moved by the eccentric bending portion 6c of the shaft 6a.

By moving the cover 5, the IC package 1 mounted thereon is also moved and the IC lead wires 3 are moved from the release position to the contact engaging position with respect to a contact 10, or from the contact engaging position to the release position with respect to the contact 10.

The contacting piece of the contact 10 is arranged such that the contacting point between the contact 10 and IC lead wire 3 is directed in the direction of the diagonal line W of the afore-mentioned lattice shaped arrangement.

More specifically, a contacting piece portion contacting with each of the contacts 10 forming the contacting point with the IC lead wire faces in the direction of the diagonal line W of the lattice shaped arrangement pattern of the IC lead wire insertion hole 7 group and contact 10 group and the displacement for the contacting engagement or release of the contact 10 is performed in direction of the diagonal line W. 10a denotes a contacting piece having an elasticity of the contact 10. 10a' denotes a contacting piece portion at the free end portion of the contacting piece 10a.

As the contact 10, a double spring type or a single spring type can be used as mentioned in the foregoing.

Figure 1:
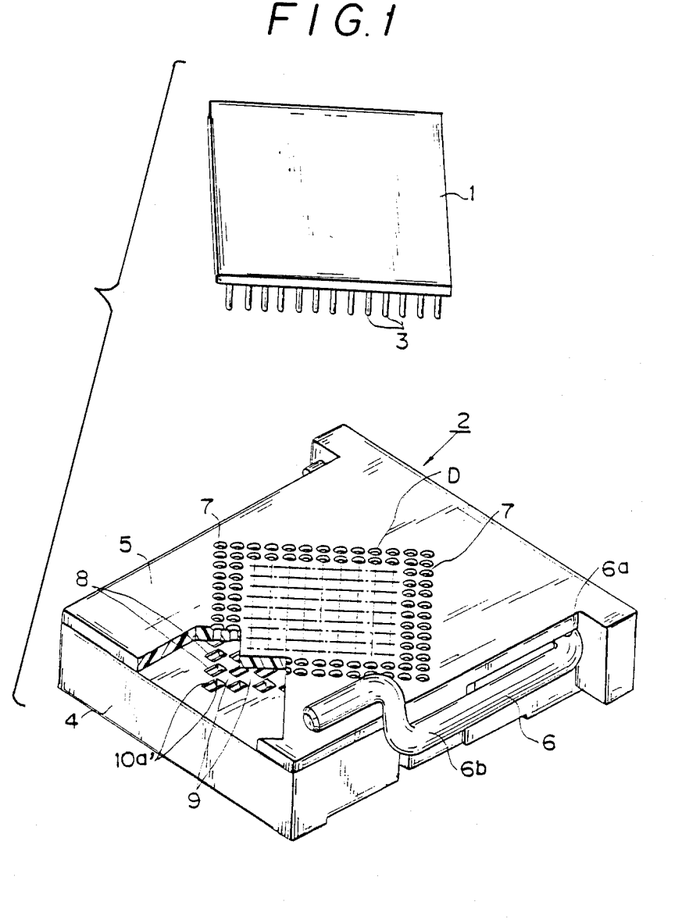
FIG. 1 is a perspective view, partly cut away, of an IC socket according to one embodiment of the present invention.
Figure 2:
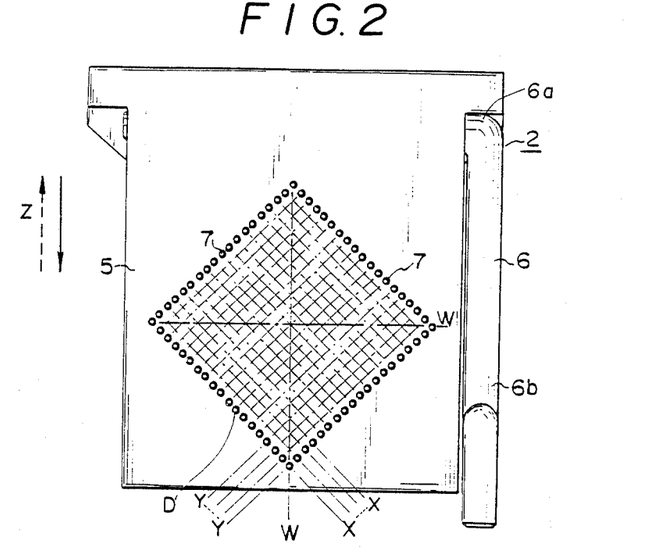
FIG. 2 is a plan view of the IC socket of FIG. 1.
Figure 3:
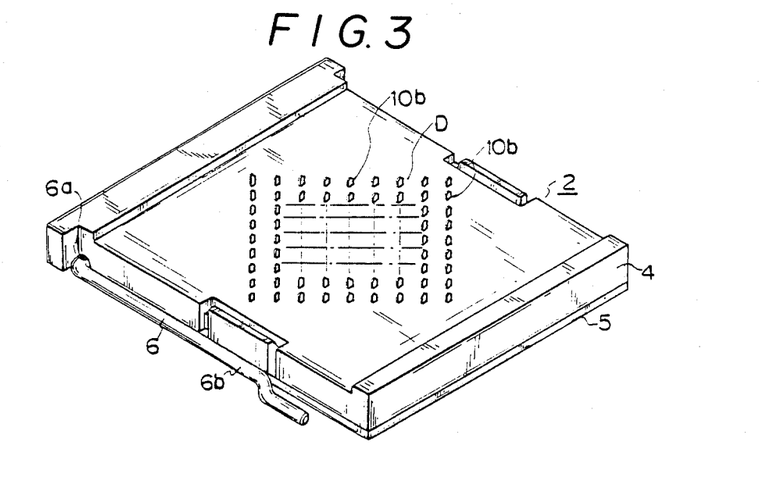
FIG. 3 is a rear perspective view of the IC socket of FIG. 1.
Figure 4:
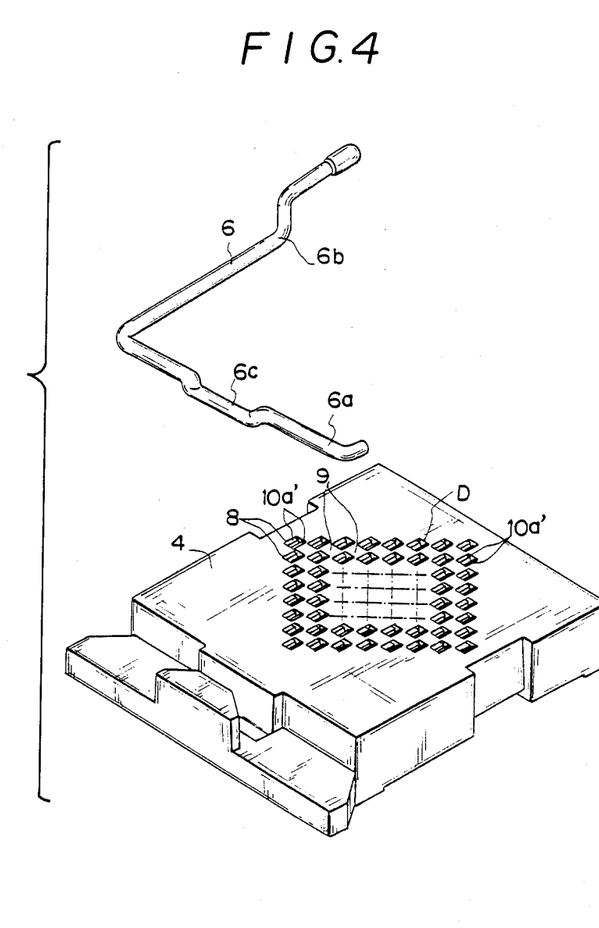
FIG. 4 is a perspective view of a base plate forming part of the socket.
Figure 5:
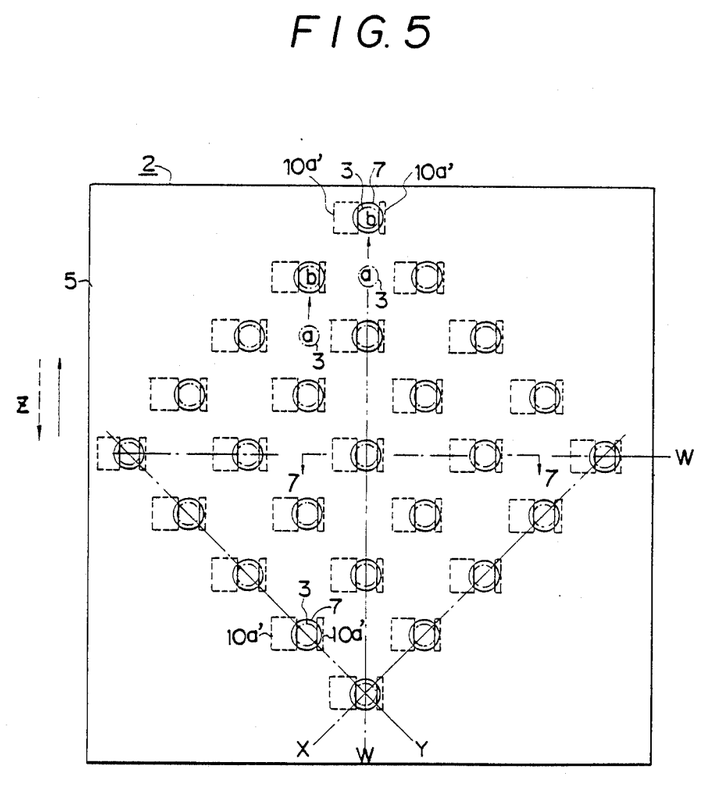
FIG. 5 is a schematic plan view of an IC socket in which the principle of the structure of the present invention is shown by way of a double spring type contact.

FIG. 5 illustrates one embodiment in which the double spring type contact 10 is arranged in the direction of the diagonal line W of the lattice shaped arrangement pattern.

As shown in the figure, the contacting piece portion 10a' of the double spring type contact 10 are opposed to each other in the direction of one of the diagonal lines W. And in this embodiment, the IC lead wires 3 move in the direction of the other diagonal line W together with the cover 5 and reach the contact engaging position b from the release position a. In the figure, Z denotes the moving directions in the directions of the diagonal lines W of the cover 5.

FIGS. 7(A) and 7(B) illustrate, by way of a sectional view taken on line 7—7 of FIG. 5, one example of a low resistance retractable socket in which the double spring type contact is used. FIG. 7(A) illustrates a release position while FIG. 7(B) illustrates a contact engaging position. From the relation shown in the sectional view, the IC lead wires 3 move from the direction perpendicular to the paper surface. That is, in FIG. 7(A), the IC lead wire is inserted toward the contact 10 in a free state through an insertion hole 7 of the IC mounting cover 5. Then, as shown in FIG. 7(B), when the cover 5 is moved in the direction perpendicular to the paper surface, the IC package 1 and IC lead wire 5 are also moved in the same direction and inserted between a pair of contacting pieces 10 of the contact 10 against the elasticity and the IC package 1 and IC lead wire 5 are subjected to a clamping pressure contact. Movement in the reverse direction of the foregoing causes movement of the parts from the contact engaging state (FIG. 7(B)) to the release state (FIG. 7(A)). In the figure, 8 denotes a contact accommodating hole formed in the socket base plate 4. The contact accommodating hole 8 is also arranged in the lattice shape in the same pattern as in the case of the lattice shaped arrangements of the IC lead wire insertion holes 7 and contacts 10. 9 denotes an insulating partition wall disposed between the adjacent contact accommodating holes 8. 10b denotes a male contact portion connected to a lower end of the contact 10 which is projected downwardly through the base plate 4.

Figure 6:
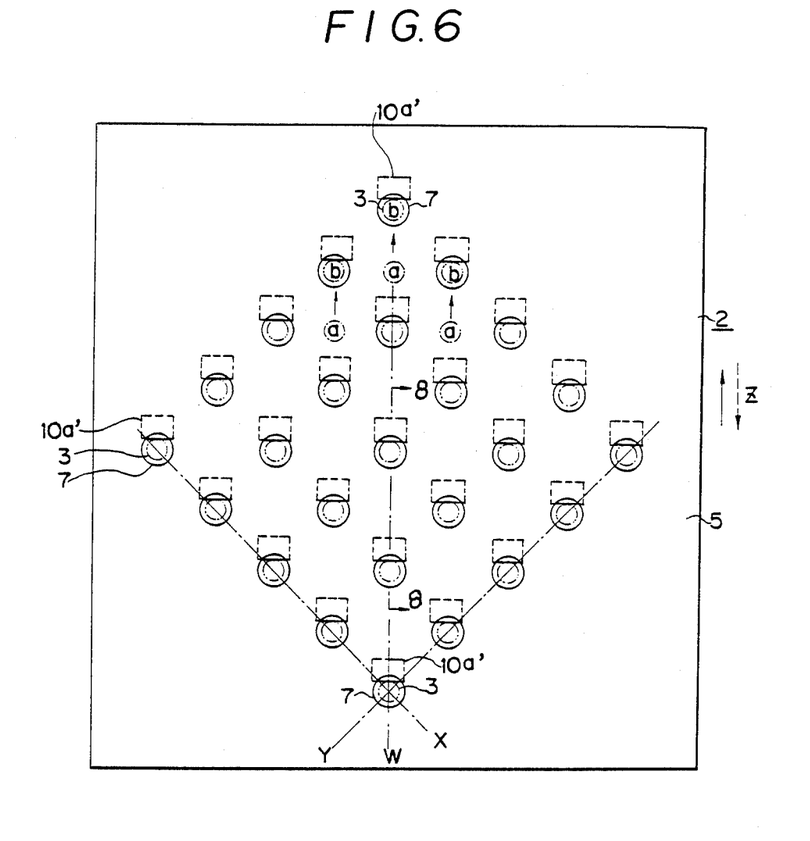
FIG. 6 is a schematic plan view of an IC socket in which the principle of the structure of the present invention is shown by way of a single spring type contact.
Figure 7:
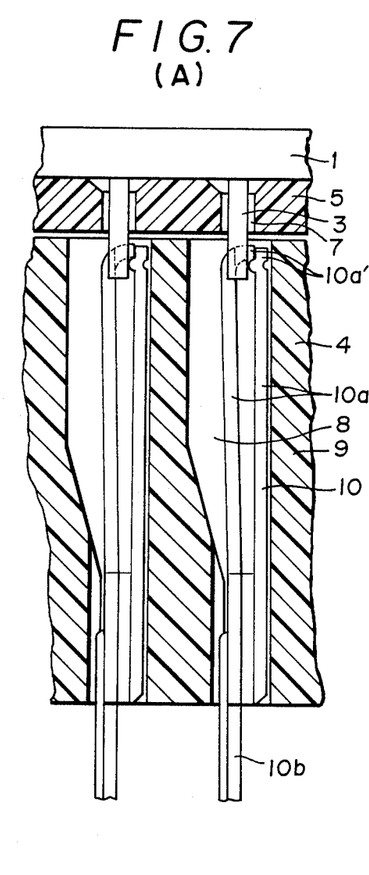
Figure 8:
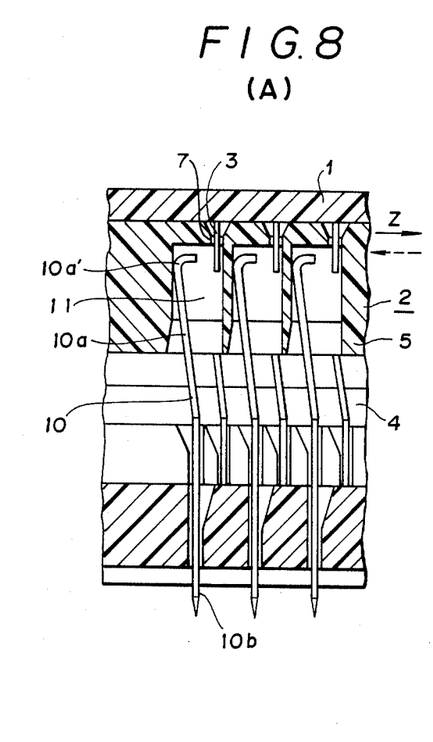

Next, FIG. 6 illustrates an embodiment in which the single spring type contact 10 is arranged in the direction of one diagonal line W of the lattice shaped arrangement pattern. As shown in the figure, the contacting piece portion 10a' of the single spring type contact 10 is arranged in an opposed position to the IC lead wire 3 in the direction of the aforementioned one of the diagonal lines W. In the embodiment, the one IC lead wire 3 moves in the direction of the diagonal line W together with the cover 5 and reaches the contact engaging position b from the release position a. In the figure, Z denotes the moving directions in the direction of the afore-mentioned diagonal line W of the cover 5. FIGS. 8(A) and 8(B) illustrate by way of a sectional view taken on line 8—8 of FIG. 6 a lattice shaped arrangement type socket in which the single spring type contact is used. In the figure, the contacting piece tip portion of the contact 10 is mounted in the base plate 4 in such a manner as to project therefrom, and the contacting piece tip portion is accommodated within the contacting piece accommodating hole 11 of the cover 5 formed right under the insertion hole 7. The cover 5 is moved in the direction as shown by the solid line arrow Z (the direction of the diagonal line W) of Fig. 8(A) to cause the IC lead wire to the separating direction (the direction of the diagonal line W) from the contacting piece 10a to bring the contact to an opened state and to allow the lead wire retraction of the IC package 1. As shown in FIG. 8(B), when the cover 5 is moved in the direction (the direction of the diagonal line W) as shown by the arrow Z of the solid line, the IC lead wire 3 is moved in the same direction, thereby bringing the lead wire into elastic contact against the contacting piece 10'.

As described in the foregoing, miniaturization of the pitch of adjacent IC lead wires is advanced in a lattice shaped arrangement type IC package. Therefore, it becomes more difficult to obtain the contact mounting space, displacement permitting back space, partition wall forming space, etc. within the space (distance corresponding to the pitch of adjacent IC lead wires on the vertical row line or lateral row line of the lattice shapedly arranged IC lead wire insertion holes and contacts) corresponding to the pitch of adjacent IC lead wires of the prior art. Further, due to the necessity to obtain a sufficient strength and proper elastic effect of the contact, it also becomes difficult to miniturize the contact more than a certain degree to satisfy the afore-mentioned requirement (to obtain enough space within the distance corresponding to the pitch of adjacent IC lead wires). The present invention makes it possible to solve the above-mentioned problem fundamentally.

That is, the present invention makes it possible to obtain in the lattice shaped arrangement type IC package socket sufficient spaces for the arrangement of the contacting piece portion of the contact group for contacting the IC lead wires, back space (space for the moving stroke and displacement of the IC lead wires in the low resistance retractable type socket) for displacing the contacting piece portion, space for providing the partition wall and the like on the diagonal lines of the lattice shaped arrangement pattern.

According to the present invention, the IC lead wire can be formed of a material having a sufficient thickness and width and the working width can be sufficiently established. Further, there can be designed a contact having the initially intended performance without inviting miniaturization, bending deformation, degrading of the elastic effect of the contact caused by miniaturization of the pitch of adjacent IC lead wires. Thus, a proper and effective measure can be obtained with respect to the miniaturization of adjacent IC lead wires.

Furthermore, the conventional low resistance retractable type socket, etc. can be put into actual use without any obstacle and without restriction with respect to miniaturization of the pitch of adjacent IC lead wires.

The effect of the present invention will be described in more detail in the light of the actual situation. When consideration is given to a compartment for a minimum unit having four IC lead wires, one side of it becomes 1.27 mm (which corresponds to the pitch of adjacent IC lead wires in the directions of the vertical row Y and lateral row X) according to the above example. If one side of the compartment is designated by x and the diagonal line is designated by y, the relation of the lengths between x and y becomes $y=\sqrt{2 \cdot x^2}$. If the afore-mentioned 1.27 mm is substituted in place of x in the relation, the length of the diagonal line y becomes $y \approx 1.796$ mm. Thus, there can be obtained a space increased by 40% (1.796:1.27) when the diagonal line y is used compared with when the distance corresponding to the pitch of adjacent IC lead wires of the prior art is used.

In this way, the significance of the effect of the present invention can be proved.

Although the present invention has been described in its preferred form with a certain degree of particularity, it is understood that the present disclosure of the preferred form has been made only by way of example and that numerous changes in the details of construction and arrangement of parts may be resorted to without departing from the spirit and the scope of the present invention as hereinafter claimed.

What is claimed is:

1. A socket for an IC package in which a plurality of IC lead wires project from a lower surface of a main body of the IC package and are arranged in a lattice shape consisting of vertical rows Y and lateral rows X, and the respective IC lead wires are arranged at equal pitches on the vertical rows Y and the lateral rows X with respect to one another, said socket comprising: a base plate constituting the main body of the socket and having contacts for contacting the IC lead wires; and an IC mounting cover on which the IC package is mountable and movable on said main body for moving the IC package between a contact engaging position and a release position, the base plate and cover constituting the IC socket being formed of an insulating material and having a square outer configuration, the IC mounting cover having a plurality of IC insertion holes arranged in a lattice shape corresponding to the lattice shaped arrangement of the IC lead wires and having respective rows X and Y of the IC lead wire insertion holes arranged in a lattice shape with the rows being inclined at the same angles with respect to respective sides of the cover, diagonal lines W of the lattice shaped arrangement extending in two directions in parallel with two sets of opposite sides of the cover respectively, the contacts of the base plate being arranged in a lattice shape corresponding to the arrangements of the IC lead wires and IC lead wire insertion holes, the respective rows X and Y of the contacts being inclined at the same angles with respect to the respective sides of the socket base plate, the diagonal lines W of the lattice shaped arrangement extending in two directions in parallel with two sets of opposite sides of the socket base plate, the direction of movement of the IC mounting cover being parallel to one of the diagonal lines W of the lattice shaped arrangements of the insertion holes and contacts, means being provided for reciprocally moving the cover in the direction of the one diagonal line for moving an IC package mounted on the cover so as to move the IC lead wires extending through the lead wire insertion holes of the cover from the release position to the contact engaging position with respect to the contacts and from the contact engaging position to the release position, the contacts having contacting pieces positioned relative to the direction of the diagonal lines W of the respective lattice shaped arrangements for being engaged in the IC lead wires when the cover is moved to move the IC lead wires to the contact engaging position and for having the IC lead wires separated therefrom when the cover is moved to move the IC lead wires to the release position.

2. A socket as claimed in claim 1, wherein said respective rows X and Y of the lattice shapedly arranged IC lead wire insertion holes are inclined at 45° with respect to the respective sides of the cover, and said respective rows X and Y of the lattice shapedly arranged contacts are inclined at 45° with respect to the respective sides of the socket base plate.

* * * * *